United States Patent [19]

Doggett

[11] 3,978,321

[45] Aug. 31, 1976

[54] PORTABLE HAND-CARRIED AUTOMOBILE COUNTING DEVICE

[76] Inventor: Robert E. Doggett, 22003 Chaparral Lane, Castro Valley, Calif. 94546

[22] Filed: Aug. 22, 1974

[21] Appl. No.: 499,478

[52] U.S. Cl. .................... 235/92 TC; 235/92 FP; 235/92 R; 340/38 R; 340/282; 340/283
[51] Int. Cl.² ...................................... H03K 21/32
[58] Field of Search .......... 235/92 R, 92 TC, 92 FP; 340/282, 283, 38 R, 38 L

[56] References Cited
UNITED STATES PATENTS

| | | | |
|---|---|---|---|
| 2,724,823 | 11/1955 | Toepfer | 340/283 |
| 3,549,869 | 12/1970 | Kuhn | 340/38 L |
| 3,579,222 | 5/1971 | Freeman | 340/283 |
| 3,614,763 | 10/1971 | Yannuzzi | 340/283 |
| 3,660,817 | 5/1972 | Abrams | 340/283 |
| 3,685,037 | 8/1972 | Bennett et al. | 340/283 |

Primary Examiner—Gareth D. Shaw
Assistant Examiner—John P. Vandenburg
Attorney, Agent, or Firm—Warren, Chickering & Grunewald

[57] ABSTRACT

A portable hand-carried battery-operated electronic automobile counting device designed for counting automobiles entering a paid parking area as a check on attendant's collection of parking fees. The devices will normally be stored when not in use in the manager's office and will be given to individual attendants for placement at appropriate parking entrance driveways prior to the start of the event which will attract persons arriving by automobile to the parking area. The device is equipped with a counter and a locking energizing switch. On delivery of the device to the attendant, the supervisor will reset the counter and lock the energizing switch in "on" position. The device is equipped with a second series connected position responsive switch which maintains the device in deactivated position while being manually carried to its position of use, and which automatically completes the energizing circuit when placed in its position of use.

1 Claim, 6 Drawing Figures

PORTABLE HAND-CARRIED AUTOMOBILE COUNTING DEVICE

BACKGROUND OF THE INVENTION

1. Field of Invention

The invention relates to devices designed for sensing the presence or passing of and counting automotive vehicles.

2. Description of Prior Art

Various traffic counting or registering devices have been proposed, see VEHICLE OPERATED TREADLE SWITCH, U.S. Pat. No. 2,161,896; and various electronic, electromagnetic devices, see U.S. Pat. Nos. 3,257,640, 3,549,869, and 3,567,912.

Applicant has also perfected and used a vehicle displaced wand switch and counter combination, see U.S. Pat. No. 3,519,803.

Mechanically operated devices are subjected to being damaged in use; and heretofore the electromagnetic devices have been installed as fixed installations using pavement-buried radiating loops or antennas. In large parking areas such as adjacent stadium, race tracks, amusements parks and the like there is a constant need for flexibility in the arrangement of lanes of traffic flow and parking area used to suit the type and amount of attendance. For this purpose sawhorses and other types of traffic barriers are moved about on the parking lot to control the inflow of traffic and the parking area used. Accordingly the entrances to the parking area controlled by those taking attendance may be subject to much change in optimizing the traffic flow to the parking area. The need has thus arisen for a portable traffic counting device which may be readily placed at any location on the parking lot area where a toll-taking entrance may be established.

SUMMARY OF INVENTION

An object of the present invention is to provide an automobile counting device of the character described which is completely portable and which may be carried by a parking attendant to any part of the parking area and when placed down in its position of use will automatically initiate its counting function as the first vehicle passes the device.

Another object of the present invention is to provide an automobile counting device of the character above in which the operation of the device is remotely controlled by a supervisor so that the device will not respond to passing vehicles while it is being carried by a parking attendant to its location of use, but will automatically initiate its operation when simply placed down on the parking lot surface as above noted.

A further object of the present invention is to provide a device of the character described which is extremely durable and rugged in its construction and fully capable of withstanding all use and abuse to which it may be subjected in being struck or run over by passing vehicles whereby the device of the present invention can be expected to give very long and useful service.

The invention possesses other objects and features of advantage, some of which, of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the Claims.

DETAILED DESCRIPTION OF INVENTION

Figure 1:
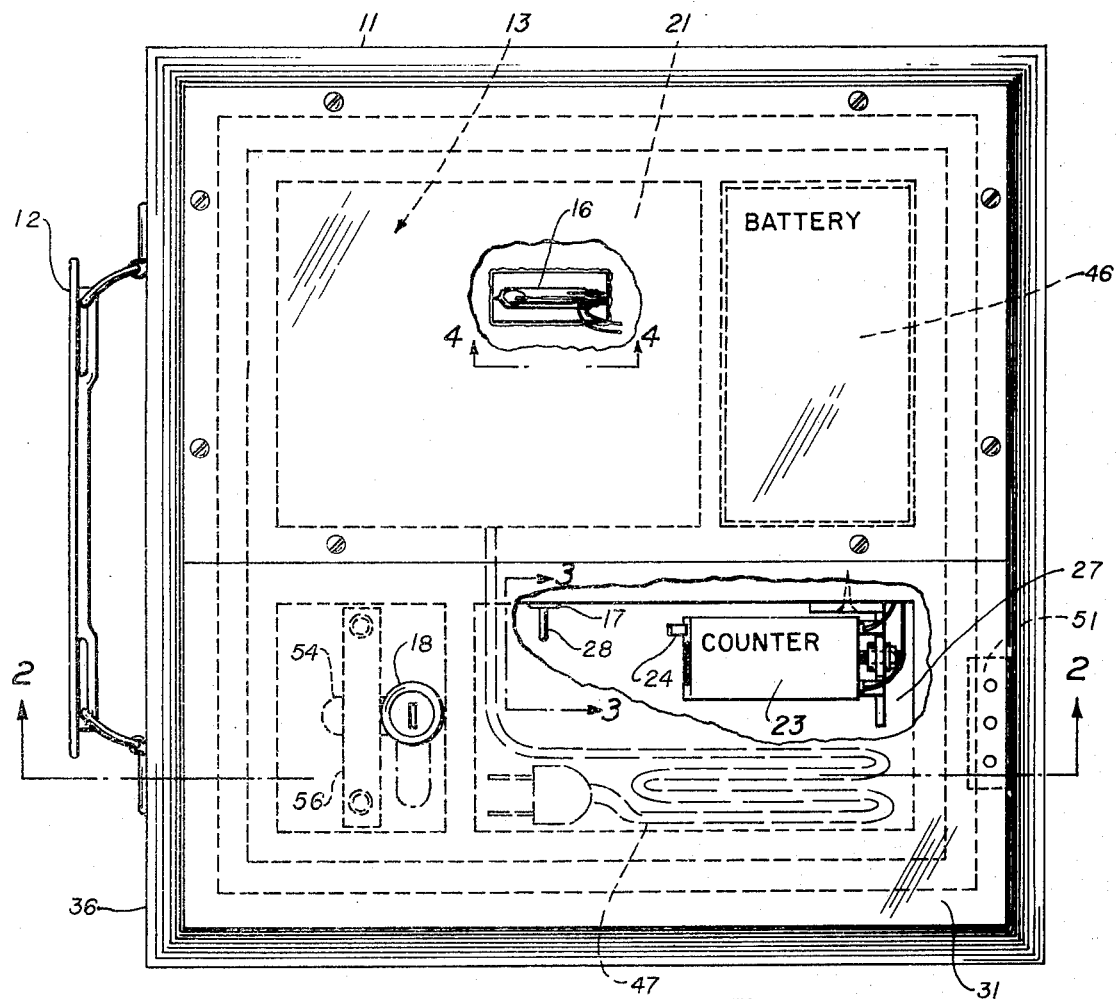
FIG. 1 is a plan view of an automobile counting device constructed in accordance with the present invention.

The automobile counting device of the present invention comprises briefly a portable housing 11 adapted to be manually carried as by handle 12 in an upright first position to and from its second position of use in a driveway traversed by automobiles to be counted; electric means 13 carried by the housing for sensing and counting automobiles passing thereby and having an energizing circuit 14; a position-responsive electric switch 16 carried by the housing and connected in circuit 14 and being open and closed in the above-noted first and second housing positions respectively; a second switch 17 carried by the housing and connected in circuit 14 and having open and closed positions co-functioning with switch 16 for controlling the energizing of means 13; and supervisor-controlled locking means 18 for controlling the open and closed positions of switch 17. Preferably means 13 consists of a BFO beat frequency metal detecting circuit 21 having an electromagnetic radiating loop or antenna 22 connected thereto. The output of circuit 21 is connected to an electrically actuated counter 23 which accumulates and displays the number of passing cars sensed by means 13. Counter 23 is here of the manually-resettable type having a reset button 24 and a visual readout 26. The BFO beat frequency metal detecting circuit is well known in the art, see for example U.S. Pat. Nos. 3,467,855 and 3,519,919.

Figure 4:
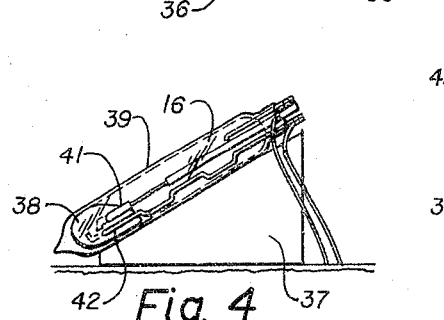
FIG. 4 is a fragmentary cross-sectional view of a portion of the device shown in position of use and taken substantially on the plane of line 4—4 of FIG. 1.
Figure 5:
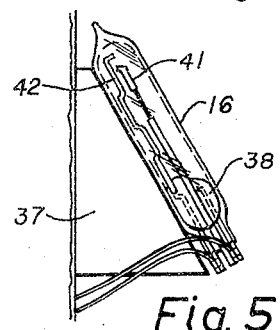
FIG. 5 is a fragmentary cross-sectional view similar to FIG. 4 but shown in a deactivated, carrying position of the device.
Figure 3:
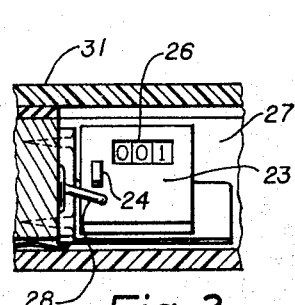
FIG. 3 is a fragmentary cross-sectional view taken substantially on the plane of line 3—3 of FIG. 1 and also of FIG. 2.
Figure 6:
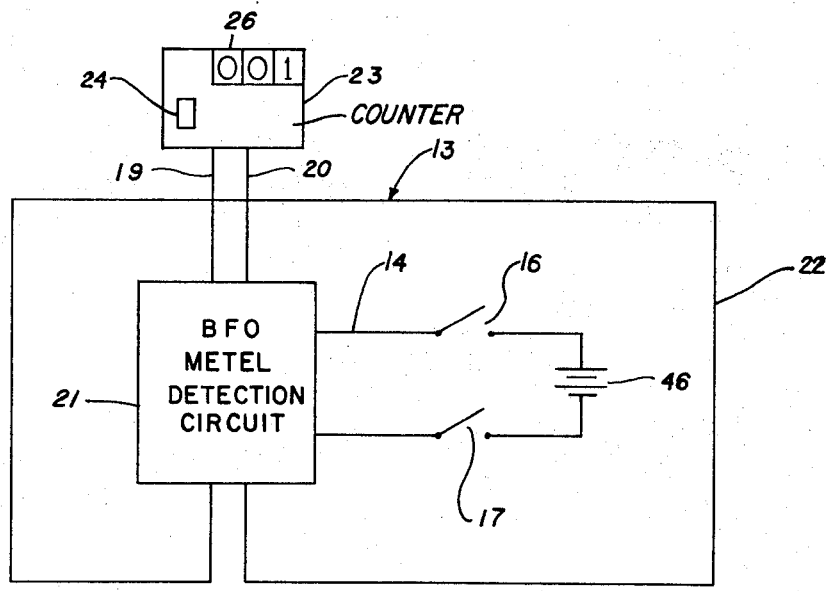
FIG. 6 is a schematic wiring diagram of the device.

As a feature of the present invention, housing 11 is formed with a compartment 27 for containing counter 23 and the switch handle 28 of switch 17; and a closure 31 is provided for compartment 27 and is equipped with a supervisor-controlled lock 18 preventing unauthorized operation of counter 23 and switch 17. When the device is to be delivered to an attendant for placement in the parking area for counting entering cars, the supervisor will by means of key 32 open lock 18 so as to remove closure 31. The supervisor will press reset button 24, resetting counter 23 to its 000 position, and will flip toggle switch handle 28 to its on position, see FIG. 3. The device will then be upended to its carrying position and closure 31 locked in compartment closing position. The supervisor will remove key 32 used to lock the closure and hand the device to the attendant for carrying to the parking lot. It will be noted that handle 12 is positioned at one end 36 of the device so that the device will normally be upended in its carrying position. In such upended position, switch 16 will automatically assume an open position, thereby de-energizing the circuit. Switch 16 may comprise a simple mercury switch as illustrated in FIGS. 1, 4 and 5. In the horizontal position of the device, as illustrated in FIGS. 1 and 4, the switch is mounted on support 37 so that the mercury 38 flows to the bottom of the tube 39 so as to close the electrical connection between switch electrodes 41 and 42. In the upended carrying position of the device, as illustrated in FIG. 5, the mercury 38 will flow away from electrodes 41 and 42 so as to open the electrical circuit. Accordingly, while the device is being carried to its position of use, the attendant may walk near to, alongside of or past vehicles or other metal without activating the device. When the attendant reaches the point of use of the device, he merely needs to lay it down flat on the pavement, which will automatically cause a closing of switch 16 and an energizing of the electronic circuit so that it will automatically initiate its counting action with the first car passing the device. As an alternative construction, switch 16 may be connected in one of the leads 19 or 20 used to connect the output of the metal detecting circuit 21 with counter 23. In the latter case, circuit 21 will be energized upon closing of switch 17, but output impulses from circuit 21 cannot be transmitted to operate counter 23 unless position-responsive switch 16 is in closed position.

The entranceway in which the device is placed is defined by the use of barriers or the like so as to cause the entering cars to proceed single file past the device as the attendant takes the parking toll and the cars proceed to the parking area. After all of the cars have so entered the parking area, which may be a short time after the start of an event, or in other cases at the close of a business day, the attendant will pick up the device by handle 12, thus causing switch 16 to automatically open and de-activate the device. Again, when so carried by the attendant, the device will not be active even though the attendant walks near to or alongside of automobiles or other metal. The attendant returns the device to his supervisor, who applies his key to lock 18 while the device remains in its upright carrying position. Upon opening closure 31, the supervisor will flip switch handle 28 to off position and read the counter for the number of vehicle parking charges for which the attendant is responsible.

Figure 2:
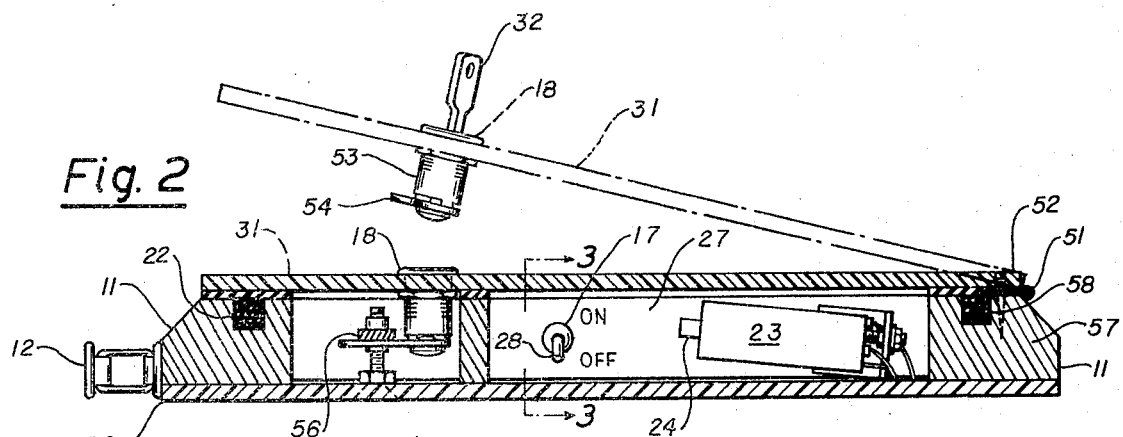
FIG. 2 is a cross-sectional view of the device taken substantially on the plane of line 2—2 of FIG. 1.

Preferably, a rechargeable battery 46 is included in circuit 14, and the charger circuit for the battery is provided with a power cord 47, which may be conveniently stored in compartment 27 and plugged into a usual 110-volt power outlet by the supervisor on return of the unit to him so as to recharge battery 46 for its next day's operation. The charger may be constructed so that it cannot overcharge the battery so that the battery can be always maintained in charged position by connecting power cord 47 to a convenience outlet when the device is not in use. To again place the device in operation, the supervisor will reset the counter to zero, place the device in its upright carrying position, flip switch 17 to its on position and lock closure 31 in place and remove and retain locking key 32. The device, while retained in its upright position, is handed to the attendant for carrying in this same position to the parking area. In the present construction, closure 31 is secured by hinge 51 to a housing 11 at one end 52 of the closure so as to swing to and from its compartment closing position, as seen in FIG. 2, in which the closure spans the compartment. Lock 18 includes a barrel 53 secured to and depending from the underside of closure 31 and a swinging detent arm 54, which may be swung by the use of key 32 into and out of a latching position under a crossbar 56 carried by the housing, see FIG. 2. If desired, closure 31 may be formed of transparent material to enable reading of the counter display 26 without opening the closure.

Preferably, and in accordance with the present invention, housing 11 has a flattened configuration as seen in the drawings, providing a low profile in its horizontal position of use and is dimensioned in such position for fitting between the wheels of an automobile with ample clearance for the automobile to move over the device with its wheels straddling the device. Little difficulty is encountered in sizing the device for this purpose. Loop 22 is carried by the housing so as to have a substantially vertical axis in the horizontal position of use of the device. Conveniently, loop 22 may be carried in a peripheral portion of the housing. With reference to FIGS. 1 and 2, housing 11 may be constructed to include a rigid peripheral frame 57 having an annular recess 58 in its top surface, and in which loop 22 may be embedded. It is important that housing be formed of hard wood or a rugged plastic such as ABS so as to be fully capable of withstanding all of the impact and abuse to which the unit may be subjected in use as well as to provide resistance to petroleum or other chemicals in or about an automobile and parking area. Closure 31, as well as the top and bottom walls of the housing, are formed of similar durable material. Also, the peripheral frame 57 may be bevelled, as seen in FIG. 2, so as to minimize the impact resulting from a vehicle wheel striking or running over the device. While normally the device will not be struck by a passing vehicle, the present device is constructed to withstand extremely rugged use and abuse, including being struck and run over by the wheels of automotive vehicles. The present device will accordingly provide dependable, secure and tamper-proof operation.

Since some automotive vehicles have a significant differential in ground clearance, considered from the front to the rear of the vehicle, it is preferable to include a delay in the system so that the counter will only count once for each vehicle passing over the counter. Under normal driving speed entering the parking area, a vehicle will pass over the device in a period of about two seconds. Accordingly, the electronic circuit is preferably designed with a built-in delay of about 2 seconds.

I claim:
1. An automobile counting device comprising:
   a portable, manually carried, thin flat housing having a car-counting position of use laid flat-wise on a driveway traversed by automobiles to be counted with the major dimension of said housing substantially parallel to the ground, and a second, upended, non-counting, carrying position with said major dimension substantially perpendicular to the ground, said housing being dimensioned to lie in counting position within the span of the wheel track and within the ground clearance of automobiles to be counted;
   electric means carried by said housing for sensing the passage of an automobile thereover and including an electromagnetic radiating loop carried by said housing adjacent the periphery of said major dimension for disposing said loop in a plane substantially parallel to the ground in said position of use;

a counter connected to said means for accumulating and displaying the number of automobiles passing over said housing in its position of use;

means functioning when said housing is in its up-ended carrying position to prevent operation of said counter; and supervisor-controlled locking means controlling the energizing of said circuit and the reading of said counter.

* * * * *